(12) United States Patent
Franken et al.

(10) Patent No.: US 11,742,175 B2
(45) Date of Patent: Aug. 29, 2023

(54) DEFECTIVE PIXEL MANAGEMENT IN CHARGED PARTICLE MICROSCOPY

(71) Applicant: FEI Company, Hillsboro, OR (US)

(72) Inventors: Erik Michiel Franken, Eindhoven (NL); Bart Jozef Janssen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/364,802

(22) Filed: Jun. 30, 2021

(65) Prior Publication Data

US 2023/0005702 A1   Jan. 5, 2023

(51) Int. Cl.
| | |
|---|---|
| H01J 37/22 | (2006.01) |
| H01J 37/244 | (2006.01) |
| H01J 37/20 | (2006.01) |
| H01J 37/26 | (2006.01) |

(52) U.S. Cl.
CPC ............ *H01J 37/20* (2013.01); *H01J 37/222* (2013.01); *H01J 37/244* (2013.01); *H01J 37/265* (2013.01); *H01J 2237/226* (2013.01); *H01J 2237/244* (2013.01)

(58) Field of Classification Search
CPC .............................. H01J 37/222; H01J 37/244
See application file for complete search history.

(56) References Cited

U.S. PATENT DOCUMENTS

| | | | |
|---|---|---|---|
| 10,825,647 B2 | 11/2020 | Janssen et al. | |
| 2006/0169901 A1* | 8/2006 | Nguyen-Huu | H01J 37/244 250/311 |
| 2017/0115409 A1* | 4/2017 | Laurence | G01T 1/2985 |
| 2018/0262705 A1* | 9/2018 | Park | H04N 5/341 |
| 2020/0402761 A1* | 12/2020 | Van Schayck | G01T 1/2914 |

OTHER PUBLICATIONS

Hui Guo, Erik Franken, Yuchen Deng, Samir Benlekbirl, Garbi Singla Lfzcano, Bart Janssen, Lingbo Yu, Zev A. Ripstein, Yong Zi Tan, John L. Rubinstein, Electron Event Representation (EER) data enables efficient cryoEM file storage with full preservation of spatial and temporal resolution, IUCrJ, vol. 7, Part 5, Sep. 2020, pp. 860-869, https://journals.iucr.org/m/issues/2020/05/00/fq5014/index.html.

* cited by examiner

*Primary Examiner* — Eliza W Osenbaugh-Stewart

(57) ABSTRACT

Disclosed herein are methods, apparatuses, systems, and computer-readable media related to defective pixel management in charged particle microscopy. For example, in some embodiments, a charged particle microscope support apparatus may include: first logic to identify a defective pixel region of a charged particle camera, wherein the charged particle camera cannot detect charged particle events in the defective pixel region; second logic to generate a first charged particle event indicator that identifies a first time and a first location of a first charged particle event outside the defective pixel region, wherein the first charged particle event is detected by the charged particle camera; third logic to generate a second charged particle event indicator that identifies a second time and a second location in the defective pixel region; and fourth logic to output data representative of the charged particle event indicators.

20 Claims, 4 Drawing Sheets

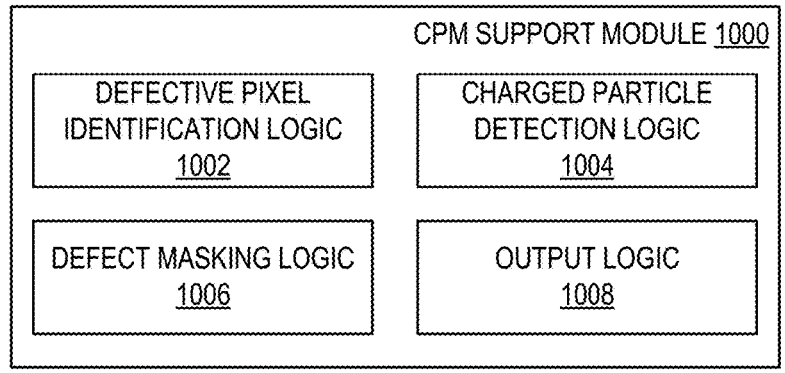
FIG. 1
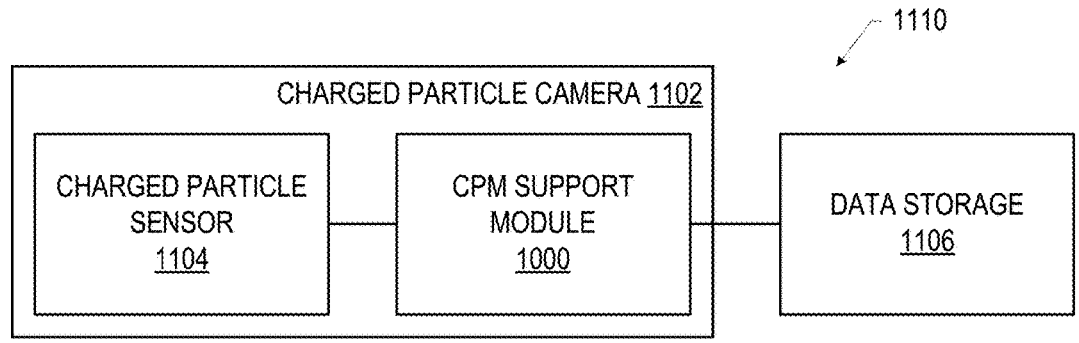
FIG. 2
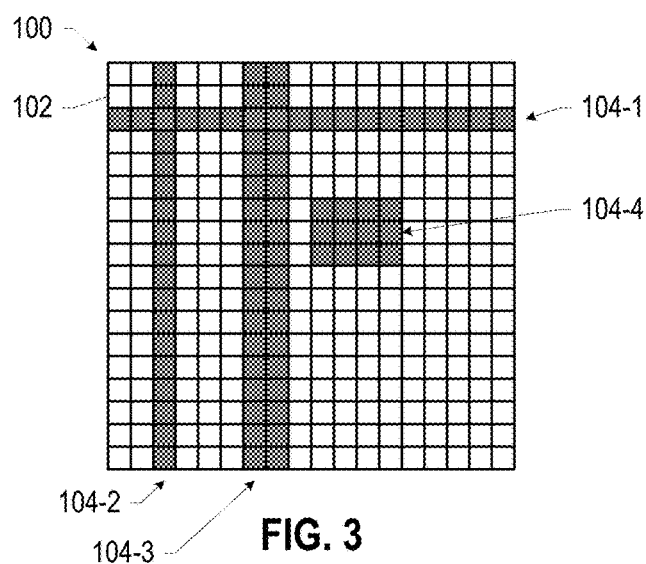
FIG. 3
| x | y | t | d/m |
|---|---|---|---|
| 3953.24 | 2845.63 | 1 | d |
| 919.78 | 1447.39 | 1 | d |
| 3864.43 | 348.13 | 1 | m |
| 3606.05 | 1539.54 | 1 | d |
| 1758.86 | 2971.55 | 2 | d |
| 1749.18 | 596.72 | 2 | m |
| 3342.11 | 3967.5 | 2 | d |
| ... | ... | ... | ... |
FIG. 4

DEFECTIVE PIXEL MANAGEMENT IN CHARGED PARTICLE MICROSCOPY

BACKGROUND

Microscopy is the technical field of using microscopes to better view objects that are difficult to see with the naked eye. Different branches of microscopy include, for example, optical microscopy, charged particle (e.g., electron and/or ion) microscopy, and scanning probe microscopy. Charged particle microscopy involves using a beam of accelerated charged particles as a source of illumination. Types of charged particle microscopy include, for example, transmission electron microscopy, scanning electron microscopy, scanning transmission electron microscopy, and ion beam microscopy.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 is a block diagram of an example charged particle microscope (CPM) support module for performing support operations, in accordance with various embodiments.

FIG. 2 is a block diagram of a CPM system that may include the CPM support module of FIG. 1, in accordance with various embodiments.

FIG. 3 illustrates example defective pixel regions of a pixel array of a charged particle sensor that may be identified by the CPM support module of FIG. 1, in accordance with various embodiments.

FIG. 4 is a table of example charged particle event indicators that may be output by the CPM support module of FIG. 1, in accordance with various embodiments.

DETAILED DESCRIPTION

Figure 5:
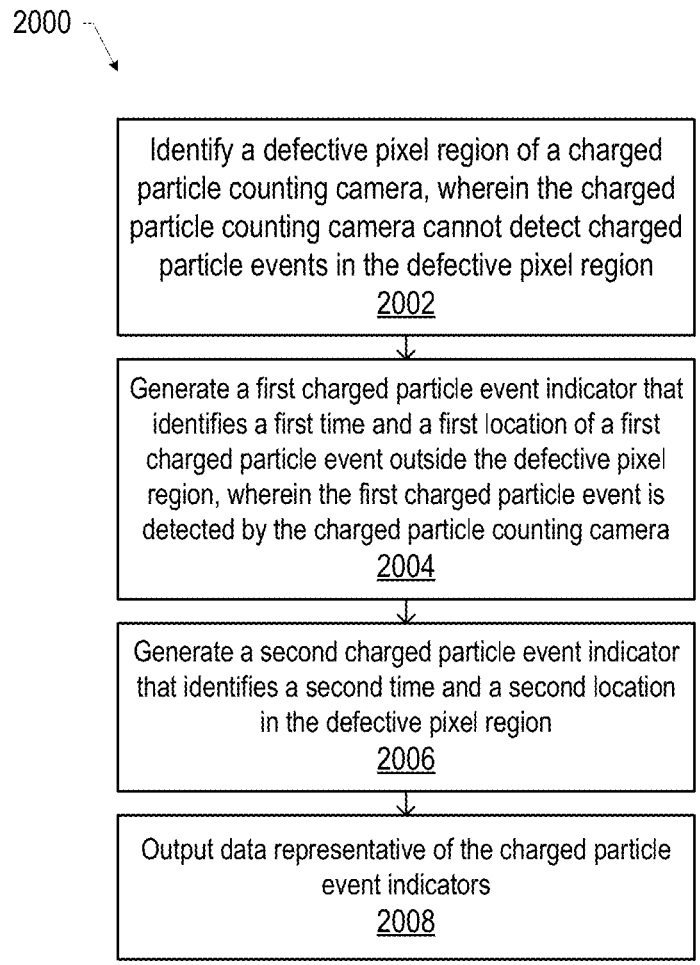
FIG. 5 is a flow diagram of an example method of performing CPM support operations, in accordance with various embodiments.

Disclosed herein are methods, apparatuses, systems, and computer-readable media related to defective pixel management in charged particle microscopy. For example, in some embodiments, a charged particle microscope (CPM) support apparatus may include: first logic to identify a defective pixel region of a charged particle camera, wherein the charged particle camera cannot detect charged particle events in the defective pixel region; second logic to generate a first charged particle event indicator that identifies a first time and a first location of a first charged particle event outside the defective pixel region, wherein the first charged particle event is detected by the charged particle camera; third logic to generate a second charged particle event indicator that identifies a second time and a second location in the defective pixel region; and fourth logic to output data representative of the charged particle event indicators.

The CPM support embodiments disclosed herein may achieve improved performance relative to conventional approaches. In conventional microscopy systems, camera defects (e.g., pixel defects, area defects row and/or: defects, etc.) are masked in camera firmware by applying image interpolation at the defect pixels using neighboring pixel value information. However, such interpolations are typically performed after transforming the stream of charged particle positions into an image representation, and thus defect information must be provided to the (typically third-party) software that performs the decoding and subsequent reconstruction. Further, because such interpolation typically requires processing the charged particle data into an image in advance, no such interpolation could be performed on data that is still in the "raw" charged particle position form (e.g., electron event representation (EER) data).

The CPM support embodiments disclosed herein may mask defects in a charged particle camera by generating "mask" charged particle event indicators associated with defect pixel locations. Such a procedure may be implemented in the hardware of the charged particle camera itself, if desired, and allows the resulting data stream to be processed by third-party or other reconstruction software as if the data were defect-free. Various ones of the embodiments disclosed herein permit defect information to be provided separately to downstream software, when desired, and achieve improved reconstruction by mitigating the presence of defects (e.g., by reducing the likelihood that shift detection, multi-image alignment, or other processes will be undesirably influenced by defects). The embodiments disclosed herein thus provide improvements to CPM technology (e.g., improvements in the computer technology supporting such CPMs, among other improvements).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

FIG. 1 is a block diagram of a CPM support module 1000 for performing support operations, in accordance with various embodiments. The CPM support module 1000 may be implemented by circuitry (e.g., including electrical and/or optical components), such as a programmed computing device. The logic of the CPM support module 1000 may be included in a single computing device, or may be distributed across multiple computing devices that are in communication with each other as appropriate. Examples of computing devices that may, singly or in combination, implement the CPM support module 1000 are discussed herein with reference to the computing device 4000 of FIG. 7, and examples of systems of interconnected computing devices, in which the CPM support module 1000 may be implemented across one or more of the computing devices, is discussed herein with reference to the CPM support system 5000 of FIG. 8. The CPM whose operations are supported by the CPM support module 1000 may include any suitable type of CPM, such as a scanning electron microscope (SEM), a transmission electron microscope (TEM), a scanning transmission electron microscope (STEM), or an ion beam microscope.

The CPM support module 1000 may include defective pixel identification logic 1002, charged particle detection logic 1004, defect masking logic 1006, and output logic 1008. As used herein, the term "logic" may include an apparatus that is to perform a set of operations associated with the logic. For example, any of the logic elements included in the CPM support module 1000 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module may not include all of the logic elements depicted in the associated drawing; for example, a module may include a subset of the logic elements depicted in the associated drawing when that module is to perform a subset of the operations discussed herein with reference to that module. In some particular embodiments, the CPM support module 1000 may be implemented by programmed field programmable gate arrays (FPGAs) that may be part of a charged particle camera.

The defective pixel identification logic 1002 may be configured to identify a defective pixel region 104 of a charged particle camera 1102 (e.g., a charged particle counting camera, such as an electron counting camera). As used herein, a "defective pixel region" of a charged particle camera 1102 may include one or more pixels that, unlike other "non-defective" pixel regions of the charged particle camera, are unable to properly detect charged particle events. FIG. 2 is a block diagram of a CPM system 1110 that includes a charged particle camera 1102 communicatively coupled to a data storage 1106 (e.g., multiple hard drives). During use, the charged particle camera 1102 may be used as part of a CPM (e.g., the CPM 5010 discussed below with reference to FIG. 8) to image a specimen, and the CPM support module 1000 may generate data (to be stored in the data storage 1106) representative of charged particle events in this imaging. Data stored in the data storage 1106 may be accessible by reconstruction logic that may perform single particle analysis (SPA), tomographic reconstruction, or any other suitable reconstruction technique using the data generated by the charged particle camera 1102 to reconstruct the microscopic structure of the specimen. In the CPM system 1110, the charged particle camera 1102 may include a charged particle sensor 1104 communicatively coupled to a CPM support module 1000 (e.g., any of the CPM support modules 1000 disclosed herein). The charged particle sensor 1104 may take any suitable form for detecting appropriate charged particles. For example, in some embodiments, the charged particle sensor 1104 may include complementing metal oxide semiconductor (CMOS) sensor pixels for electron detection. The defective pixel identification logic 1002 of a CPM support module 1000 may identify one or more defective pixel regions 104 of the charged particle sensor 1104 of a charged particle camera 1102, and may store the identification of the one or more defective pixel regions 104 in a memory accessible by the defective pixel identification logic 1002 (e.g., the defective pixel identification logic 1002 may store identifiers of which pixels 102 in a pixel array 100, as discussed below with reference to FIG. 3, are defective).

FIG. 3 illustrates example defective pixel regions 104 of a pixel array 100 (made up of individual pixels 102) of a charged particle sensor 1104 that may be identified by the defective pixel identification logic 1002, in accordance with various embodiments. FIG. 3 illustrates three particular example defective pixel regions 104: a defective region 104-1 that includes a row of defective pixels 102 (also referred to as a "row defect," an example of a "line defect"), a defective pixel region 104-2 that includes a column of defective pixels 102 (also referred to as a "column defect," another example of a "line defect"), a defective region 104-3 that includes two adjacent columns of defective pixels 102 (also referred to as a "double column defect"), and a defective region 104-4 that includes a rectangular 3×4 array of defective pixels 102 (also referred to as an "area defect"). The particular number, arrangement, and sizes of the defective pixel regions 104 in FIG. 3 is simply illustrative, and a charged particle camera 1102 may include any number and arrangement of defective pixel regions 104. For example, in some embodiments, a defective pixel region 104 may include a single pixel 102, and/or one or more non-rectangular areas of pixels.

In some embodiments, the defective pixel identification logic 1002 may store the identification of defective pixel regions 104 of a charged particle camera 1102 when the charged particle camera 1102 is manufactured or initially sold. For example, during manufacturing or test, defective pixel regions 104 of a charged particle sensor 1104 may be identified, and the defective pixel identification logic 1002 may store information regarding these defective pixel regions 104. In some embodiments, the defective pixel identification logic 1002 may "update" or otherwise store new information about defective pixel regions 104 of a charged particle camera 1102 after commencement of operation of the charged particle camera 1102. For example, the defective pixel identification logic 1002 may perform periodic tests of the pixels 102 of a pixel array 100 of a charged particle sensor 1104, and when pixels 102 are newly identified (or confirmed) as defective (e.g., due to radiation damage or other deterioration), the defective pixel identification logic 1002 may update the stored list or other identification of the defective pixel regions 104 accordingly. In this manner, the defective pixel identification logic 1002 may continue to monitor the pixels 102 for defects during the lifetime of the charged particle camera 1102.

The charged particle detection logic 1004 may be configured to generate charged particle event indicators based on charged particle events detected by the non-defective pixels 102 of the pixel array 100 of a charged particle sensor 1104. When a charged particle event is detected by a non-defective pixel 102, the charged particle detection logic 1004 may receive information about this charged particle event from the charged particle sensor 1104 (e.g., via a fiber-optic cable or other communication link), and in response, the charged particle detection logic 1004 may generate a charged particle event indicator representative of this charged particle event. In particular, the charged particle event indicator may identify a time and a location of the charged particle event. In some embodiments, the time of a charged particle event indicator may be a frame interval N, representative of the associated charged particle event happening during the frame interval associated with the capture of the Nth frame of pixel array data; combining the frame number N with the frame rate may allow a time (e.g., in the unit of seconds) to be identified. In some embodiments, the location of a charged particle event indicator may reflect the particular pixel 102 (and/or sub-pixels, or other locations) at which the associated charged particle event was detected. Charged particle event indicators generated by the charged particle detection logic 1004 may include other charged particle event information in addition to time and location, as desired.

The defect masking logic 1006 may also be configured to generate charged particle event indicators, but these charged particle event indicators may not correspond to "detected" charged particle events detected by a charged particle camera 1102. Instead, the defect masking logic 1006 may generate "mask" (or "fake") charged particle event indicators associated with locations within one or more of the defective pixel regions 104.

The defect masking logic 1006 may generate the charged particle event indicators for a defective pixel 102 based on an estimate of the local charged particle radiation dose rate at the defective pixel 102, and such an estimate may rely on the "detected" charged particle events occurring at non-defective pixels 102 of a charged particle camera 1102. Thus, the defect masking logic 1006 may generate charged particle event indicators based on the charged particle events occurring at the non-defective pixels 102. In some embodiments, the defect masking logic 1006 may apply deterministic criteria to generate charged particle event indicators based on the charged particle events occurring at the non-defective pixels 102 of a charged particle camera 1102. For example, the defect masking logic 1006 may generate a "mask" charged particle event indicator whose location corresponds to a defective pixel 102 when a majority of the non-defective pixels 102 closest to the defective pixel 102 detect a charged particle event (e.g., within a single frame interval or other time period). The deterministic criteria that may be applied by the defect masking logic 1006 may be chosen in any desired manner.

In some embodiments, the defect masking logic 1006 may apply probabilistic criteria to generate charged particle event indicators based on the charged particle events occurring (and not occurring) at the non-defective pixels 102 of the charged particle camera 1102. For example, the defect masking logic 1006 may generate a "mask" charged particle event indicator whose location corresponds to a defective pixel 102 with a probability that increases with the number of neighboring (e.g., one or more spatially neighboring or otherwise proximate and/or temporally neighboring or otherwise proximate) non-defective pixels 102 that detected a charged particle event (e.g., within a single frame interval or other time). In one particular example, a defective pixel 102 X in a "column defect" defective pixel region 104 (like the defective pixel region 104-2 of FIG. 3) may have "left-right" neighboring pixels 102 A and B (such that the defective pixel 102 X is between neighboring pixel 102 A and neighboring pixel 102 B), and the defect masking logic 1006 may generate a charged particle event indicator corresponding to the defective pixel 102 X in a frame interval N with probability zero when no charged particle events are detected by pixels 102 A and B in the frame interval N, with probability 0.5 when a charged particle event is detected by pixel 102 A in the frame interval N but not by the pixel 102 B (and vice versa), and with probability 1 when a charged particle event is detected by both pixels 102 A and B in the frame interval N. This probabilistic rule may be represented as shown in Table 1 below, wherein a "0" in the A and B columns indicates no charged particle event is detected by the associated pixel 102, and a "1" in the A and B columns indicates that a charged particle event is detected by the associated pixel 102.

TABLE 1

| A | B | P(X) |
|---|---|------|
| 0 | 0 | 0 |
| 0 | 1 | ½ |
| 1 | 0 | ½ |
| 1 | 1 | 1 |

In a related example, the defect masking logic 1006 may generate a charged particle event indicator corresponding to a defective pixel 102 X in a "column defect" defective pixel region 104 (like that discussed above with reference to Table 1) in accordance with the probabilistic rule of Table 2, in which $$\beta = \alpha \frac{1-d}{d}$$

where $0 \leq \alpha$, $d \leq 1$ and can be selected as desired. The parameter d in the embodiments disclosed herein may represent an average or expected dose rate in charged particles (e.g., electrons) per pixel per frame, and may be estimated based on past frames. The parameter d, or any of the other parameters used by the defect masking logic 1006 to generate charged particle event indicators, may be static or dynamic (e.g., may change over time as a function of imaging performance, such as a running estimate of dose rate).

TABLE 2

| A | B | P(X) |
|---|---|------|
| 0 | 0 | $\alpha$ |
| 0 | 1 | $\frac{1}{2}\alpha + \frac{1}{2}(1 - \beta)$ |
| 1 | 0 | $\frac{1}{2}\alpha + \frac{1}{2}(1 - \beta)$ |
| 1 | 1 | $(1 - \beta)$ |

In another related example, the defect masking logic 1006 may generate a charged particle event indicator corresponding to a defective pixel 102 X in a "column defect" defective pixel region 104 (like that discussed above with reference to Table 1) in accordance with the probabilistic rule of Table 3, in which $$\beta = \alpha \frac{1-d}{d}$$

where $0 \leq \alpha, d, g_A, g_B \leq 1$ and can be selected as desired. The parameters $g_A$ and $g_B$ in the embodiments disclosed herein may be "gain factors" that are to be applied to the neighboring pixels 102 A and 102 B.

TABLE 3

| A | B | P(X) |
|---|---|------|
| 0 | 0 | $\frac{1}{2}(g_A + g_B)\alpha$ |
| 0 | 1 | $\frac{1}{2}(\alpha g_A + (1 - \beta)g_B)$ |
| 1 | 0 | $\frac{1}{2}(\alpha g_B + (1 - \beta)g_A)$ |
| 1 | 1 | $\frac{1}{2}(g_A + g_B)(1 - \beta)$ |

In another example, the defect masking logic 1006 may generate a charged particle event indicator corresponding to defective pixels 102 X1 and X2 in a "double column defect" defective pixel region 104 (like the defective pixel region 104-3 of FIG. 3) when the defective pixel 102 X1 has "left-right" closest neighboring pixels 102 A and X2 (such that the defective pixel 102 X1 is between neighboring pixel 102 A and neighboring pixel 102 X2) and the defective pixel 102 X2 has "left-right" closest neighboring pixels 102 X1 and B (such that the defective pixel 102 X2 is between neighboring pixel 102 X1 and neighboring pixel 102 B), in accordance with the probabilistic rule of Table 4.

TABLE 4

| A | B | P(X1) | P(X2) |
|---|---|-------|-------|
| 0 | 0 | 0 | 0 |
| 0 | 1 | ⅓ | ⅔ |
| 1 | 0 | ⅔ | ⅓ |
| 1 | 1 | 1 | 1 |

These particular examples are simply illustrative, and the defect masking logic 1006 may implement any suitable deterministic criteria, probabilistic criteria, and/or combination of deterministic criteria and probabilistic criteria for generating the "mask" charged particle event indicators. For example, the defect masking logic 1006 may apply a probabilistic rule for the generation of a charged particle event indicator for a defective pixel 102 in which the "influence" of charged particle events happening at non-defective pixels 102 decreases as the distance between the defective pixel 102 and the non-defective pixel 102 increases. Similarly, although the examples given above are examples in which the defect masking logic 1006 generates "mask" charged particle event indicators for defective pixel regions 104 based on "detected" charged particle events in a same frame interval or other time period, the defect masking logic 1006 may similarly generate "mask" charged particle event indicators for defective pixel regions 104 in one frame interval or other time period based on "detected" charged particle events in a different frame interval or other time period (e.g., temporally "adjacent" frame intervals or other time periods). For example, the defect masking logic 1006 may apply a probabilistic rule for the generation of a charged particle event indicator for a defective pixel 102 at a particular time in which the "influence" of charged particle events happening at non-defective pixels 102 at different times decreases as the temporal distance between the particular time and the different times increases. In this way, the defect masking logic 1006 may generate "mask" charged particle event indicators (including location and time information) for defective pixel regions 104 based on deterministic and/or probabilistic criteria relating to the location of "detected" charged particle events and/or based on deterministic and/or probabilistic criteria relating to the time of "detected" charged particle events.

The output logic 1008 may be configured to output data representative of the charged particle event indicators generated by the charged particle detection logic 1004 (i.e., representing "detected" charged particle events) and the defect masking logic 1006 (i.e., representing "mask" charged particle events). For example, FIG. 4 is a table of example charged particle event indicators (corresponding to the rows of the table) that may be output by the output logic 1008, in accordance with various embodiments. Each of the charged particle event indicators depicted in FIG. 4 includes location information (i.e., the x and y coordinates) and time information (i.e., a frame number). In some embodiments, the charged particle event indicators provided by the output logic 1008 may also include an indicator of whether the charged particle event indicator corresponds to a "detected" charged particle event (and was therefore generated by the charged particle detection logic 1004) or to a "mask" charged particle event (was therefore generated by the defect masking logic 1006). For example, the charged particle event indicators of FIG. 4 also include a "d(etected)/m(ask)" indicator, with a "d" indicating that the charged particle event indicator corresponds to a "detected" charged particle event and an "m" indicating that the charged particle event indicator corresponds to a "mask" charged particle event. In other embodiments, the charged particle event indicators provided by the output logic 1008 may not include an indicator of whether the charged particle event indicator corresponds to a "detected" or a "mask" charged particle event. As noted above, in some embodiments, the output logic 1008 may output the charged particle event indicators to reconstruction logic (e.g., via the data storage 1106) that is to use the data to perform SPA, tomographic reconstruction, or other reconstruction techniques and thereby obtain information about the specimen imaged by the charged particle camera 1102.

Charged particle event indicators may be output by the output logic 1008 (e.g., to the data storage 1106 of the CPM system 1110 via an ethernet cable or any other suitable communication link) in any of a number of ways. In some embodiments, the data output by the output logic 1008 may include a charged particle event representation data (e.g., electron event representation (EER) data). In some embodiments, the output logic 1008 may stream the charged particle event indicators as they are generated by the charged particle detection logic 1004 and the defect masking logic 1006. In some embodiments, the output logic 1008 may queue or buffer the charged particle event indicators (e.g., so the defect masking logic 1006 can generate "mask" charged particle event indicators for a particular time based on "detected" charged particle events happening after that time). The output logic 1008 may encode the charged particle event indicators and any desired manner; for example, the output logic 1008 may output the charged particle event indicators as a stream of packets. In some embodiments, the output logic 1008 may provide a first data stream that includes charged particle event indicators generated by the charged particle detection logic 1004 (i.e., associated with "detected" charged particle events) and a second, different data stream that includes charged particle event indicators generated by the defect masking logic 1006 (i.e., associated with "mask" charged particle events).

Data representative of charged particle event indicators, output by the output logic 1008, may not include the charged particle event indicators themselves. For example, in some embodiments, the output logic 1008 may output an image or other summary of charged particle event indicators; such an image or other summary may represent a collection of charged particle event indicators (detected and/or masked), and may be collected over time such that the particular times associated with the charged particle event indicators is not represented in the image or other summary.

In some embodiments, the output logic 1008 may output information about the defective pixel regions 104 (e.g., to the data storage 1106 of the CPM system 1110) in addition to the charged particle event indicators. For example, the output logic 1008 may include identification information about the defective pixel regions 104 (e.g., the locations of defective pixel regions 104 as identified by the defective pixel identification logic 1002) in headers of data streams that include charged particle event indicators. In another example, the output logic 1008 may provide a first data stream that includes charged particle event indicators and a second, different data stream that includes information about the defective pixel regions 104. In another example, the defective pixel identification logic 1002 and/or the output logic 1008 may include identification information about the defective pixel regions 104 as separate files that can be stored alongside the charged particle event indicators (e.g., in the data storage 1106) or may be otherwise accessed. Such files be provided in any suitable format, such as Extensible Markup Language (XML), JavaScript Object Notation (JSON), or Comma-Separated Value (CSV).

FIG. 5 is a flow diagram of a method 2000 of performing CPM support operations, in accordance with various embodiments. Although the operations of the method 2000 may be illustrated with reference to particular embodiments disclosed herein (e.g., the CPM support modules 1000 discussed herein with reference to FIG. 1, the GUI 3000 discussed herein with reference to FIG. 6, the computing devices 4000 discussed herein with reference to FIG. 7, and/or the CPM support system 5000 discussed herein with reference to FIG. 8), the method 2000 may be used in any suitable setting to perform any suitable CPM support operations. Operations are illustrated once each and in a particular order in FIG. 5, but the operations may be reordered and/or repeated as desired and appropriate (e.g., different operations performed may be performed in parallel, as suitable).

At 2002, a defective pixel region of a charged particle camera may be identified, wherein the charged particle camera cannot detect charged particle events in the defective pixel region. For example, the defective pixel identification logic 1002 of a CPM support module 1000 may perform the operations of 2002 in accordance with any of the embodiments disclosed herein.

At 2004, a first charged particle event indicator that identifies a first time and a first location of a first charged particle event outside the defective pixel region may be generated, wherein the first charged particle event is detected by the charged particle camera. For example, the charged particle detection logic 1004 of a CPM support module 1000 may perform the operations of 2004 in accordance with any of the embodiments disclosed herein.

At 2006, a second charged particle event indicator that identifies a second time and a second location in the defective pixel region may be generated. For example, the defect masking logic 1006 of a CPM support module 1000 may perform the operations of 2006 in accordance with any of the embodiments disclosed herein.

At 2008, data representative of the charged particle event indicators may be output. For example, the output logic 1008 of a CMP support module 1000 may perform the operations of 2008 in accordance with any of the embodiments disclosed herein.

Figure 7:
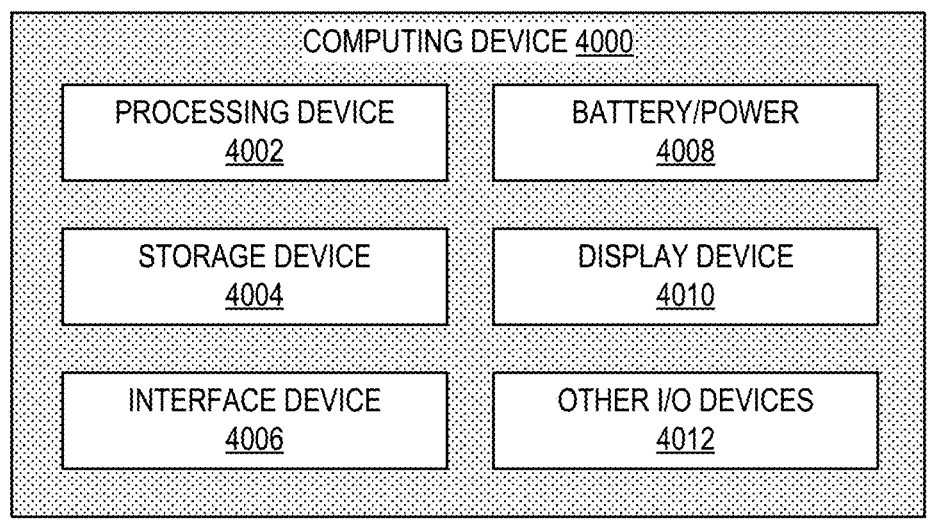
FIG. 7 is a block diagram of an example computing device that may perform some or all of the CPM support methods disclosed herein, in accordance with various embodiments.
Figure 8:
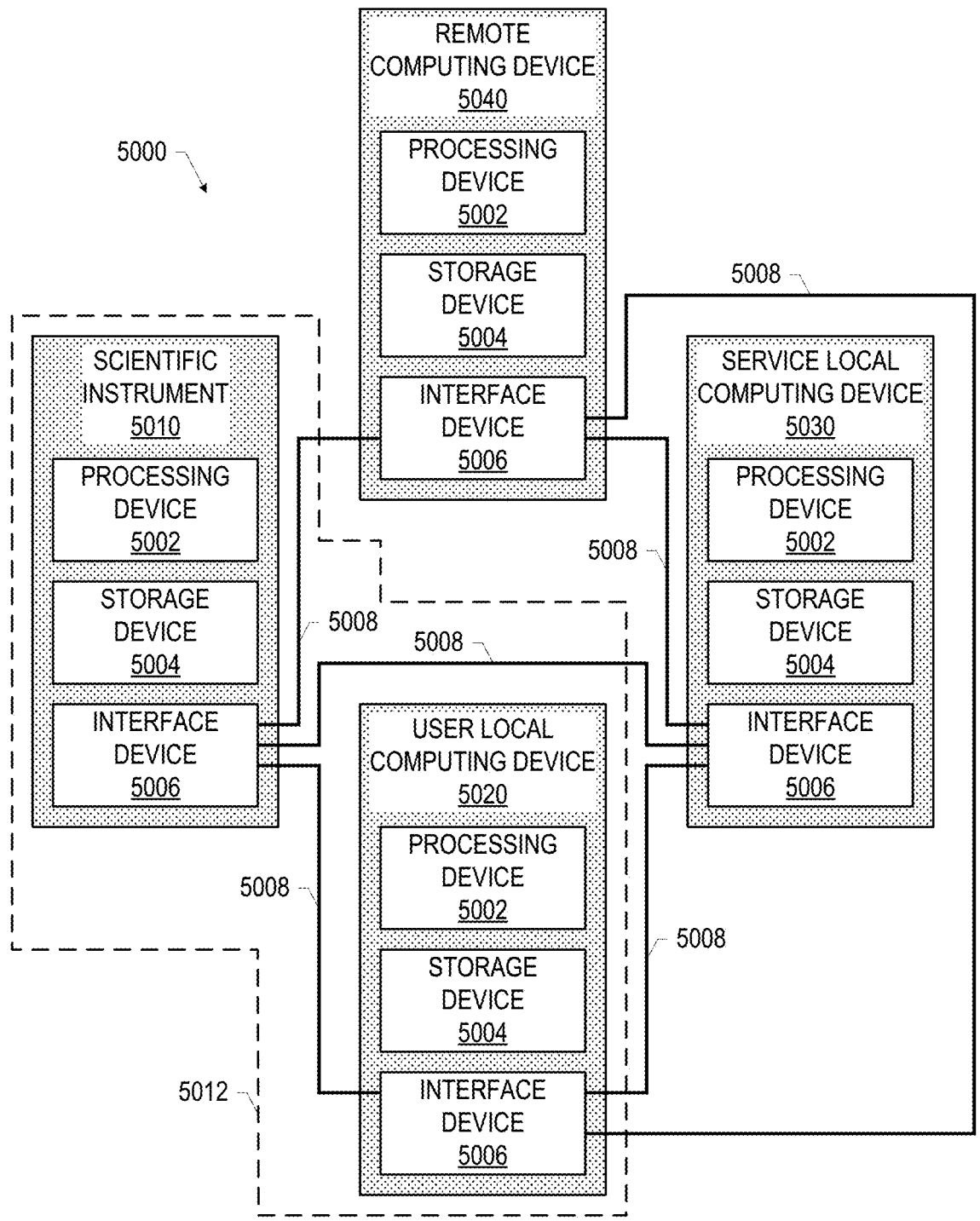
FIG. 8 is a block diagram of an example CPM support system in which some or all of the CPM support methods disclosed herein may be performed, in accordance with various embodiments.

The CPM support methods disclosed herein may include interactions with a human user (e.g., via the user local computing device 5020 discussed herein with reference to FIG. 8). These interactions may include providing information to the user (e.g., information regarding the operation of a CPM such as the CPM 5010 of FIG. 8, information regarding a sample being analyzed or other test or measurement performed by a CPM, information retrieved from a local or remote database, or other information) or providing an option for a user to input commands (e.g., to control the operation of a CPM such as the CPM 5010 of FIG. 8, or to control the analysis of data generated by a CPM), queries (e.g., to a local or remote database), or other information. In some embodiments, these interactions may be performed through a graphical user interface (GUI) that includes a visual display on a display device (e.g., the display device 4010 discussed herein with reference to FIG. 7) that provides outputs to the user and/or prompts the user to provide inputs (e.g., via one or more input devices, such as a keyboard, mouse, trackpad, or touchscreen, included in the other I/O devices 4012 discussed herein with reference to FIG. 7). The CPM support systems disclosed herein may include any suitable GUIs for interaction with a user.

Figure 6:
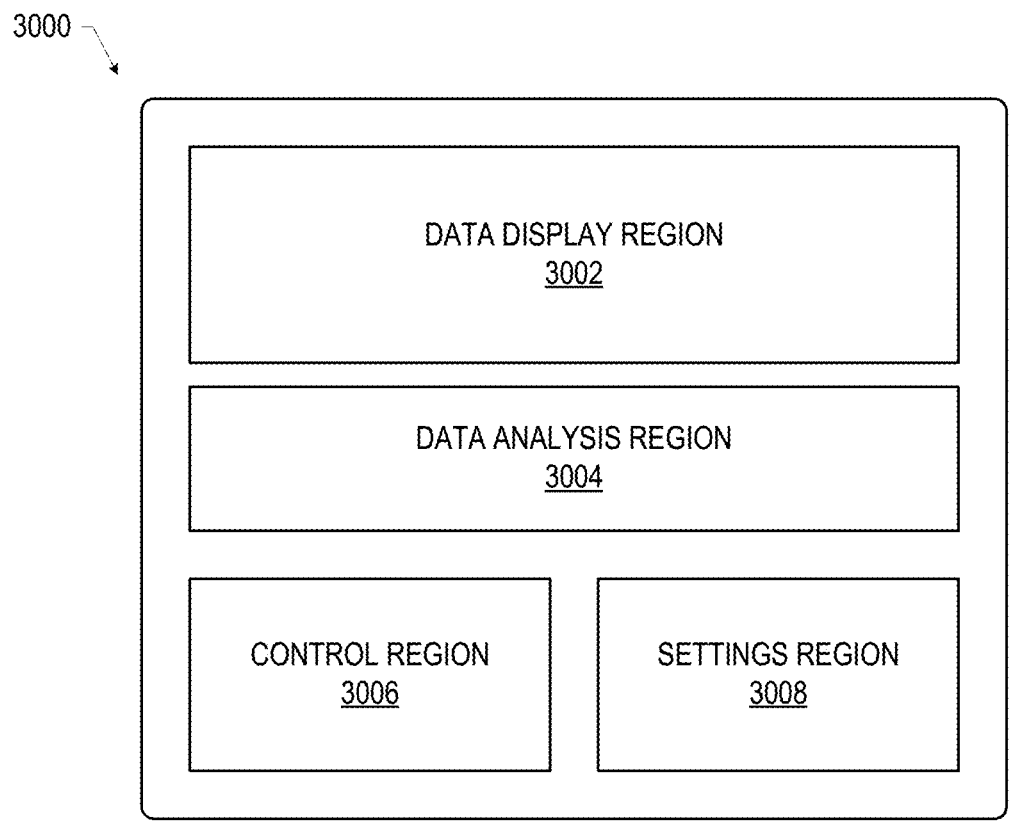
FIG. 6 is an example of a graphical user interface that may be used in the performance of some or all of the CPM support methods disclosed herein, in accordance with various embodiments.

FIG. 6 depicts an example GUI 3000 that may be used in the performance of some or all of the support methods disclosed herein, in accordance with various embodiments. As noted above, the GUI 3000 may be provided on a display device (e.g., the display device 4010 discussed herein with reference to FIG. 7) of a computing device (e.g., the computing device 4000 discussed herein with reference to FIG. 7) of a CPM support system (e.g., the CPM support system 5000 discussed herein with reference to FIG. 8), and a user may interact with the GUI 3000 using any suitable input device (e.g., any of the input devices included in the other I/O devices 4012 discussed herein with reference to FIG. 7) and input technique (e.g., movement of a cursor, motion capture, facial recognition, gesture detection, voice recognition, actuation of buttons, etc.).

The GUI 3000 may include a data display region 3002, a data analysis region 3004, a CPM control region 3006, and a settings region 3008. The particular number and arrangement of regions depicted in FIG. 6 is simply illustrative, and any number and arrangement of regions, including any desired features, may be included in a GUI 3000.

The data display region 3002 may display data generated by a CPM (e.g., the CPM 5010 discussed herein with reference to FIG. 8). For example, the data display region 3002 may display charged particle event indicators output by the output logic 1008 of a CPM support module 1000.

The data analysis region 3004 may display the results of data analysis (e.g., the results of analyzing the data illustrated in the data display region 3002 and/or other data). For example, the data analysis region 3004 may display a reconstruction or other representation of a specimen imaged in accordance with any of the techniques disclosed herein. In some embodiments, the data display region 3002 and the data analysis region 3004 may be combined in the GUI 3000 (e.g., to include data output from a CPM, and some analysis of the data, in a common graph or region).

The CPM control region 3006 may include options that allow the user to control a CPM (e.g., the CPM 5010 discussed herein with reference to FIG. 8). For example, the CPM control region 3006 may include control options to program, start, or stop imaging operations.

The settings region 3008 may include options that allow the user to control the features and functions of the GUI 3000 (and/or other GUIs) and/or perform common computing operations with respect to the data display region 3002 and data analysis region 3004 (e.g., saving data on a storage device, such as the storage device 4004 discussed herein with reference to FIG. 7, sending data to another user, labeling data, etc.). For example, the settings region 3008 may include information about defective pixel regions 104 of the charged particle camera 1102 (e.g., as identified by the defective pixel identification logic 1002) or controls to allow a user to view and/or change the criteria used by the defect masking logic 1006 when generating "mask" charged particle event indicators).

As noted above, the CPM support module 1000 may be implemented by one or more computing devices. FIG. 7 is a block diagram of a computing device 4000 that may perform some or all of the CPM support methods disclosed herein, in accordance with various embodiments. In some embodiments, the CPM support module 1000 may be implemented by a single computing device 4000 or by multiple computing devices 4000. Further, as discussed below, a computing device 4000 (or multiple computing devices 4000) that implements the CPM support module 1000 may be part of one or more of the CPM 5010, the user local computing device 5020, the service local computing device 5030, or the remote computing device 5040 of FIG. 8.

The computing device 4000 of FIG. 7 is illustrated as having a number of components, but any one or more of these components may be omitted or duplicated, as suitable for the application and setting. In some embodiments, some or all of the components included in the computing device 4000 may be attached to one or more motherboards and enclosed in a housing (e.g., including plastic, metal, and/or other materials). In some embodiments, some these components may be fabricated onto a single system-on-a-chip (SoC) (e.g., an SoC may include one or more processing devices 4002 and one or more storage devices 4004). Additionally, in various embodiments, the computing device 4000 may not include one or more of the components illustrated in FIG. 7, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 4000 may not include a display device 4010, but may include display device interface circuitry (e.g., a connector and driver circuitry) to which a display device 4010 may be coupled.

The computing device 4000 may include a processing device 4002 (e.g., one or more processing devices). As used herein, the term "processing device" may refer to any device or portion of a device that processes electronic data from registers and/or memory to transform that electronic data into other electronic data that may be stored in registers and/or memory. The processing device 4002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 4000 may include a storage device 4004 (e.g., one or more storage devices). The storage device 4004 may include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 4004 may include memory that shares a die with a processing device 4002. In such an embodiment, the memory may be used as cache memory and may include embedded dynamic random-access memory (eDRAM) or spin transfer torque magnetic random-access memory (STT-MRAM), for example. In some embodiments, the storage device 4004 may include non-transitory computer readable media having instructions thereon that, when executed by one or more processing devices (e.g., the processing device 4002), cause the computing device 4000 to perform any appropriate ones of or portions of the methods disclosed herein.

The computing device 4000 may include an interface device 4006 (e.g., one or more interface devices 4006). The interface device 4006 may include one or more communication chips, connectors, and/or other hardware and software to govern communications between the computing device 4000 and other computing devices. For example, the interface device 4006 may include circuitry for managing wireless communications for the transfer of data to and from the computing device 4000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Circuitry included in the interface device 4006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). In some embodiments, circuitry included in the interface device 4006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 4006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 4006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 4006 may include one or more antennas (e.g., one or more antenna arrays) to receipt and/or transmission of wireless communications.

In some embodiments, the interface device 4006 may include circuitry for managing wired communications, such as electrical, optical, or any other suitable communication protocols. For example, the interface device 4006 may include circuitry to support communications in accordance with Ethernet technologies. In some embodiments, the interface device 4006 may support both wireless and wired communication, and/or may support multiple wired communication protocols and/or multiple wireless communication protocols. For example, a first set of circuitry of the interface device 4006 may be dedicated to shorter-range wireless communications such as Wi-Fi or Bluetooth, and a second set of circuitry of the interface device 4006 may be dedicated to longer-range wireless communications such as global positioning system (GPS), EDGE, GPRS, CDMA, WiMAX, LTE, EV-DO, or others. In some embodiments, a first set of circuitry of the interface device 4006 may be dedicated to wireless communications, and a second set of circuitry of the interface device 4006 may be dedicated to wired communications.

The computing device 4000 may include battery/power circuitry 4008. The battery/power circuitry 4008 may include one or more energy storage devices (e.g., batteries or capacitors) and/or circuitry for coupling components of the computing device 4000 to an energy source separate from the computing device 4000 (e.g., AC line power).

The computing device 4000 may include a display device 4010 (e.g., multiple display devices). The display device 4010 may include any visual indicators, such as a heads-up display, a computer monitor, a projector, a touchscreen display, a liquid crystal display (LCD), a light-emitting diode display, or a flat panel display.

The computing device 4000 may include other input/output (I/O) devices 4012. The other I/O devices 4012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 4000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 4000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra-mobile personal computer, etc.), a desktop computing device, or a server computing device or other networked computing component.

One or more computing devices implementing any of the CPM support modules or methods disclosed herein may be part of a CPM support system. FIG. 8 is a block diagram of an example CPM support system 5000 in which some or all of the CPM support methods disclosed herein may be performed, in accordance with various embodiments. The CPM support modules and methods disclosed herein (e.g., the CPM support module 1000 of FIG. 1 and the method 2000 of FIG. 5) may be implemented by one or more of the CPM 5010, the user local computing device 5020, the service local computing device 5030, or the remote computing device 5040 of the CPM support system 5000.

Any of the CPM 5010, the user local computing device 5020, the service local computing device 5030, or the remote computing device 5040 may include any of the embodiments of the computing device 4000 discussed herein with reference to FIG. 7, and any of the CPM 5010, the user local computing device 5020, the service local computing device 5030, or the remote computing device 5040 may take the form of any appropriate ones of the embodiments of the computing device 4000 discussed herein with reference to FIG. 7.

The CPM 5010, the user local computing device 5020, the service local computing device 5030, or the remote computing device 5040 may each include a processing device 5002, a storage device 5004, and an interface device 5006. The processing device 5002 may take any suitable form, including the form of any of the processing devices 4002 discussed herein with reference to FIG. 4, and the processing devices 5002 included in different ones of the CPM 5010, the user local computing device 5020, the service local computing device 5030, or the remote computing device 5040 may take the same form or different forms. The storage device 5004 may take any suitable form, including the form of any of the storage devices 5004 discussed herein with reference to FIG. 4, and the storage devices 5004 included in different ones of the CPM 5010, the user local computing device 5020, the service local computing device 5030, or the remote computing device 5040 may take the same form or different forms. The interface device 5006 may take any suitable form, including the form of any of the interface devices 4006 discussed herein with reference to FIG. 4, and the interface devices 5006 included in different ones of the CPM 5010, the user local computing device 5020, the service local computing device 5030, or the remote computing device 5040 may take the same form or different forms.

The CPM 5010, the user local computing device 5020, the service local computing device 5030, and the remote computing device 5040 may be in communication with other elements of the CPM support system 5000 via communication pathways 5008. The communication pathways 5008 may communicatively couple the interface devices 5006 of different ones of the elements of the CPM support system 5000, as shown, and may be wired or wireless communication pathways (e.g., in accordance with any of the communication techniques discussed herein with reference to the interface devices 4006 of the computing device 4000 of FIG. 7). The particular CPM support system 5000 depicted in FIG. 8 includes communication pathways between each pair of the CPM 5010, the user local computing device 5020, the service local computing device 5030, and the remote computing device 5040, but this "fully connected" implementation is simply illustrative, and in various embodiments, various ones of the communication pathways 5008 may be absent. For example, in some embodiments, a service local computing device 5030 may not have a direct communication pathway 5008 between its interface device 5006 and the interface device 5006 of the CPM 5010, but may instead communicate with the CPM 5010 via the communication pathway 5008 between the service local computing device 5030 and the user local computing device 5020 and the communication pathway 5008 between the user local computing device 5020 and the CPM 5010.

The user local computing device 5020 may be a computing device (e.g., in accordance with any of the embodiments of the computing device 4000 discussed herein) that is local to a user of the CPM 5010. In some embodiments, the user local computing device 5020 may also be local to the CPM 5010, but this need not be the case; for example, a user local computing device 5020 that is in a user's home or office may be remote from, but in communication with, the CPM 5010 so that the user may use the user local computing device 5020 to control and/or access data from the CPM 5010. In some embodiments, the user local computing device 5020 may be a laptop, smartphone, or tablet device. In some embodiments the user local computing device 5020 may be a portable computing device.

The service local computing device 5030 may be a computing device (e.g., in accordance with any of the embodiments of the computing device 4000 discussed herein) that is local to an entity that services the CPM 5010. For example, the service local computing device 5030 may be local to a manufacturer of the CPM 5010 or to a third-party service company. In some embodiments, the service local computing device 5030 may communicate with the CPM 5010, the user local computing device 5020, and/or the remote computing device 5040 (e.g., via a direct communication pathway 5008 or via multiple "indirect" communication pathways 5008, as discussed above) to receive data regarding the operation of the CPM 5010, the user local computing device 5020, and/or the remote computing device 5040 (e.g., the results of self-tests of the CPM 5010, calibration coefficients used by the CPM 5010, the measurements of sensors associated with the CPM 5010, etc.). In some embodiments, the service local computing device 5030 may communicate with the CPM 5010, the user local computing device 5020, and/or the remote computing device 5040 (e.g., via a direct communication pathway 5008 or via multiple "indirect" communication pathways 5008, as discussed above) to transmit data to the CPM 5010, the user local computing device 5020, and/or the remote computing device 5040 (e.g., to update programmed instructions, such as firmware, in the CPM 5010, to initiate the performance of test or calibration sequences in the CPM 5010, to update programmed instructions, such as software, in the user local computing device 5020 or the remote computing device 5040, etc.). A user of the CPM 5010 may utilize the CPM 5010 or the user local computing device 5020 to communicate with the service local computing device 5030 to report a problem with the CPM 5010 or the user local computing device 5020, to request a visit from a technician to improve the operation of the CPM 5010, to order consumables or replacement parts associated with the CPM 5010, or for other purposes.

The remote computing device 5040 may be a computing device (e.g., in accordance with any of the embodiments of the computing device 4000 discussed herein) that is remote from the CPM 5010 and/or from the user local computing device 5020. In some embodiments, the remote computing device 5040 may be included in a datacenter or other large-scale server environment. In some embodiments, the remote computing device 5040 may include network-attached storage (e.g., as part of the storage device 5004). The remote computing device 5040 may store data generated by the CPM 5010, perform analyses of the data generated by the CPM 5010 (e.g., in accordance with programmed instructions), facilitate communication between the user local computing device 5020 and the CPM 5010, and/or facilitate communication between the service local computing device 5030 and the CPM 5010.

In some embodiments, one or more of the elements of the CPM support system 5000 illustrated in FIG. 8 may not be present. Further, in some embodiments, multiple ones of various ones of the elements of the CPM support system 5000 of FIG. 8 may be present. For example, a CPM support system 5000 may include multiple user local computing devices 5020 (e.g., different user local computing devices 5020 associated with different users or in different locations). In another example, a CPM support system 5000 may include multiple CPMs 5010, all in communication with service local computing device 5030 and/or a remote computing device 5040; in such an embodiment, the service local computing device 5030 may monitor these multiple CPMs 5010, and the service local computing device 5030 may cause updates or other information may be "broadcast" to multiple CPMs 5010 at the same time. Different ones of the CPMs 5010 in a CPM support system 5000 may be located close to one another (e.g., in the same room) or farther from one another (e.g., on different floors of a building, in different buildings, in different cities, etc.). In some embodiments, a CPM 5010 may be connected to an Internet-of-Things (IoT) stack that allows for command and control of the CPM 5010 through a web-based application, a virtual or augmented reality application, a mobile application, and/or a desktop application. Any of these applications may be accessed by a user operating the user local computing device 5020 in communication with the CPM 5010 by the intervening remote computing device 5040. In some embodiments, a CPM 5010 may be sold by the manufacturer along with one or more associated user local computing devices 5020 as part of a local CPM computing unit 5012.

The following paragraphs provide various examples of the embodiments disclosed herein.

Example 1 is a charged particle microscope support apparatus, including: first logic to identify a defective pixel region of a charged particle camera, wherein the charged particle camera cannot detect charged particle events in the defective pixel region; second logic to generate a first charged particle event indicator that identifies a first time and a first location of a first charged particle event outside the defective pixel region, wherein the first charged particle event is detected by the charged particle camera; third logic to generate a second charged particle event indicator that identifies a second time and a second location in the defective pixel region; and fourth logic to output data representative of the charged particle event indicators.

Example 2 includes the subject matter of Example 1, and further specifies that the second charged particle event indicator is not representative of a charged particle event detected by the charged particle camera.

Example 3 includes the subject matter of any of Examples 1-2, and further specifies that the third logic is to generate the second charged particle event indicator based at least in part on the first charged particle event.

Example 4 includes the subject matter of any of Examples 1-3, and further specifies that the third logic is to generate the second charged particle event indicator based at least in part on the first time.

Example 5 includes the subject matter of any of Examples 1-4, and further specifies that the third logic is to generate the second charged particle event indicator based at least in part on the first location.

Example 6 includes the subject matter of any of Examples 1-5, and further specifies that the third logic is to generate the second charged particle event indicator probabilistically based at least in part on the first charged particle event.

Example 7 includes the subject matter of any of Examples 1-6, and further specifies that the first location is adjacent to the second location.

Example 8 includes the subject matter of any of Examples 1-7, and further specifies that the first time is equal to the second time.

Example 9 includes the subject matter of any of Examples 1-8, and further specifies that the first time is associated with a same frame as the second time.

Example 10 includes the subject matter of any of Examples 1-9, and further specifies that the data output by the fourth logic is representative of a charged particle event not occurring at a third time and third location, and the third logic is to generate the second charged particle event indicator probabilistically based at least in part on the charged particle event not occurring at the third time and third location.

Example 11 includes the subject matter of Example 10, and further specifies that the second location is adjacent to the third location.

Example 12 includes the subject matter of any of Examples 10-11, and further specifies that the second time is equal to the third time.

Example 13 includes the subject matter of any of Examples 1-12, and further specifies that the second time is associated with a same frame as the third time.

Example 14 includes the subject matter of any of Examples 1-13, and further specifies that the third logic is to generate the second charged particle event indicator probabilistically based at least in part on a distance between the first location and the second location.

Example 15 includes the subject matter of Example 14, and further specifies that the data output by the fourth logic is representative of a charged particle event not occurring at a third time and third location, and the third logic is to generate the second charged particle event indicator probabilistically based at least in part on a distance between the second location and the third location.

Example 16 includes the subject matter of any of Examples 1-15, and further specifies that the third logic is to generate the second charged particle event indicator probabilistically based at least in part on a difference between the first time and the second time.

Example 17 includes the subject matter of any of Examples 1-16, and further specifies that the data output by the fourth logic is representative of a charged particle event not occurring at a third time and third location, and the third logic is to generate the second charged particle event indicator probabilistically based at least in part on a difference between the second time and the third time.

Example 18 includes the subject matter of any of Examples 1-17, and further specifies that the third logic is to generate the second charged particle event indicator based on one or more charged particle events occurring at one or more locations proximate to the second location.

Example 19 includes the subject matter of Example 18, and further specifies that the one or more locations proximate to the second location are one or more locations neighboring the second location.

Example 20 includes the subject matter of Example 19, and further specifies that the second location includes a pixel, and the one or more locations neighboring the second location are one or more pixels neighboring the pixel.

Example 21 includes the subject matter of any of Examples 18-19, and further specifies that the one or more locations proximate to the second location includes a first proximate location and a second proximate location, and the third logic is to generate the second charged particle event indicator probabilistically with greater probability based on a charged particle event at the first proximate location than a charged particle event at the second proximate location.

Example 22 includes the subject matter of any of Examples 18-21, and further specifies that the third logic is to generate the second charged particle event indicator probabilistically with unequal probabilities of generating the second charged particle event indicator and not generating the second charged particle event indicator.

Example 23 includes the subject matter of any of Examples 1-22, and further specifies that the defective pixel region includes a line of pixels.

Example 24 includes the subject matter of any of Examples 1-22, and further specifies that the defective pixel region includes a single pixel.

Example 25 includes the subject matter of any of Examples 1-22, and further specifies that the defective pixel region includes multiple adjacent lines of pixels.

Example 26 includes the subject matter of any of Examples 1-22, and further specifies that the defective pixel region includes a rectangular area of pixels.

Example 27 includes the subject matter of any of Examples 1-22, and further specifies that the defective pixel region includes a non-rectangular area of pixels.

Example 28 includes the subject matter of any of Examples 1-27, and further specifies that the data output by the fourth logic includes electron event representation (EER) data.

Example 29 includes the subject matter of any of Examples 1-28, and further specifies that the second charged particle event indicator identifies that the second charged particle event indicator is not representative of a detected charged particle event.

Example 30 includes the subject matter of any of Examples 1-28, and further specifies that the second charged particle event indicator does not identify that the second charged particle event indicator is not representative of a detected charged particle event.

Example 31 includes the subject matter of any of Examples 1-30, and further specifies that the first logic is to provide data representative of the defective pixel region in an Extensible Markup Language (XML) file, a JavaScript Object Notation (JSON) file, or a Comma-Separated Value (CSV) file.

Example 32 includes the subject matter of any of Examples 1-31, and further specifies that the fourth logic is to output data representative of the defective pixel region along with the data representative of the charged particle event indicators.

Example 33 includes the subject matter of any of Examples 1-32, and further specifies that the fourth logic is to output the data to reconstruction logic.

Example 34 includes the subject matter of Example 33, and further specifies that the reconstruction logic is to perform single particle analysis or tomographic reconstruction.

Example 35 includes the subject matter of any of Examples 1-34, and further specifies that the first logic, second logic, third logic, and fourth logic are included in the charged particle camera.

Example 36 includes the subject matter of any of Examples 1-35, and further specifies that the first logic is to identify a defective pixel region by generating a list of defective pixels.

Example 37 includes the subject matter of any of Examples 1-36, and further specifies that the first logic is to store an initial identification of the defective pixel region and to update its identification of the defective pixel region after commencement of operation of the charged particle camera.

Example 38 includes the subject matter of any of Examples 1-37, and further specifies that the fourth logic is to output the data representative of the charged particle event indicators by streaming the data representative of the charged particle event indicators.

Example 39 includes the subject matter of any of Examples 1-38, and further specifies that the charged particle camera is included in a charged particle microscope.

Example 40 includes the subject matter of Example 39, and further includes: a charged particle sensor, of the charged particle camera, to detect charged particle events.

Example 41 includes the subject matter of any of Examples 1-40, and further specifies that the second charged particle event indicator is one of a plurality of charged particle event indicators, and the third logic is to generate the plurality of charged particle event indicators that individually identify an associated time and an associated location in the defective pixel region.

Example 42 includes the subject matter of Example 41, and further specifies that the plurality of charged particle event indicators are not representative of charged particle events detected by the charged particle camera.

Example 43 includes the subject matter of any of Examples 41-42, and further specifies that the third logic is to generate the plurality of charged particle event indicators based at least in part on the first charged particle event.

Example 44 includes the subject matter of any of Examples 41-43, and further specifies that the third logic is to generate the plurality of charged particle event indicators based at least in part on the first time.

Example 45 includes the subject matter of any of Examples 41-44, and further specifies that the third logic is to generate the plurality of charged particle event indicators based at least in part on the first location.

Example 46 includes the subject matter of any of Examples 41-45, and further specifies that the third logic is to generate the plurality of charged particle event indicators probabilistically based at least in part on the first charged particle event.

Example 47 includes the subject matter of any of Examples 41-46, and further specifies that the associated locations are adjacent to the second location.

Example 48 includes the subject matter of any of Examples 41-47, and further specifies that the first time is equal to the associated times.

Example 49 includes the subject matter of any of Examples 41-48, and further specifies that the first time is associated with a same frame as the associated times.

Example 50 is a charged particle microscope support apparatus, including: first logic to identify a defective pixel region of a charged particle camera, wherein the charged particle camera cannot detect charged particle events in the defective pixel region; second logic to generate a charged particle event indicator for a location in the defective pixel region based at least in part on one or more charged particle events detected outside the defective pixel region; and third logic to output data representative of the charged particle event indicator.

Example 51 includes the subject matter of Example 50, and further specifies that the charged particle event indicator is not representative of a charged particle event detected by the charged particle camera.

Example 52 includes the subject matter of any of Examples 50-51, and further specifies that the second logic is to generate the charged particle event indicator probabilistically based at least in part on one or more charged particle events detected outside the defective pixel region.

Example 53 includes the subject matter of any of Examples 50-52, and further specifies that the location is a first location, and the one or more charged particle events detected outside the defective pixel region includes a charged particle event at least one location adjacent to the first location.

Example 54 includes the subject matter of any of Examples 50-53, and further specifies that the second logic is to generate the charged particle event indicator probabilistically based at least in part on one or more charged particle events detected outside the defective pixel region by generating the charged particle event with a first probability when a charged particle event occurs at a location outside the defective pixel region and by generating the charged particle event with a second probability when no charged particle event occurs at the location outside the defective pixel region.

Example 55 includes the subject matter of Example 54, and further specifies that the location outside the defective pixel region is a location adjacent to the defective pixel region.

Example 56 includes the subject matter of any of Examples 50-55, and further specifies that the second logic is to generate the charged particle event indicator for the location in the defective pixel region in a frame capture time interval based at least in part on one or more charged particle events detected outside the defective pixel region in the frame capture time interval.

Example 57 includes the subject matter of any of Examples 50-56, and further specifies that the second logic is to generate the charged particle event indicator for the location in the defective pixel region in a frame capture time interval based at least in part on one or more charged particle events detected outside the defective pixel region outside the frame capture time interval.

Example 58 includes the subject matter of any of Examples 50-57, and further specifies that the second logic is to generate the charged particle event indicator probabilistically based at least in part on one or more charged particle events detected outside the defective pixel region by generating the charged particle event with a first probability when a charged particle event occurs at a first location outside the defective pixel region and by generating the charged particle event with a second probability, different from the first probability, when a charged particle event occurs at a second location, different from the first location, outside the defective pixel region.

Example 59 includes the subject matter of any of Examples 50-58, and further specifies that the defective pixel region includes a line of pixels.

Example 60 includes the subject matter of any of Examples 50-58, and further specifies that the defective pixel region includes a single pixel.

Example 61 includes the subject matter of any of Examples 50-58, and further specifies that the defective pixel region includes multiple adjacent lines of pixels.

Example 62 includes the subject matter of any of Examples 50-58, and further specifies that the defective pixel region includes a rectangular area of pixels.

Example 63 includes the subject matter of any of Examples 50-58, and further specifies that the defective pixel region includes a non-rectangular area of pixels.

Example 64 includes the subject matter of any of Examples 50-63, and further specifies that the data output by the third logic includes electron event representation (EER) data.

Example 65 includes the subject matter of any of Examples 50-64, and further specifies that the charged particle event indicator identifies that the charged particle event indicator is not representative of a detected charged particle event.

Example 66 includes the subject matter of any of Examples 50-64, and further specifies that the charged particle event indicator does not identify that the charged particle event indicator is not representative of a detected charged particle event.

Example 67 includes the subject matter of any of Examples 50-66, and further specifies that the first logic is to provide data representative of the defective pixel region in an Extensible Markup Language (XML) file, a JavaScript Object Notation (JSON) file, or a Comma-Separated Value (CSV) file.

Example 68 includes the subject matter of any of Examples 50-67, and further specifies that the third logic is to output data representative of the defective pixel region along with the data representative of the charged particle event indicator.

Example 69 includes the subject matter of any of Examples 50-68, and further specifies that the third logic is to output the data to reconstruction logic.

Example 70 includes the subject matter of Example 69, and further specifies that the reconstruction logic is to perform single particle analysis or tomographic reconstruction.

Example 71 includes the subject matter of any of Examples 50-70, and further specifies that the first logic, second logic, and third logic are included in the charged particle camera.

Example 72 includes the subject matter of any of Examples 50-71, and further specifies that the first logic is to identify a defective pixel region by generating a list of defective pixels.

Example 73 includes the subject matter of any of Examples 50-72, and further specifies that the first logic is to store an initial identification of the defective pixel region and to update its identification of the defective pixel region after commencement of operation of the charged particle camera.

Example 74 includes the subject matter of any of Examples 50-73, and further specifies that the third logic is to output data representative of a plurality of charged particle event indicators by streaming the data representative of the plurality of charged particle event indicators.

Example 75 includes the subject matter of any of Examples 50-74, and further specifies that the charged particle camera is included in a charged particle microscope.

Example 76 includes the subject matter of Example 75, and further includes: a charged particle sensor, of the charged particle camera, to detect charged particle events.

Example 77 is a charged particle microscope support apparatus, including: first logic to generate a first charged particle event indicator that identifies a first time and a first location of a first charged particle event outside a defective pixel region of a charged particle camera, wherein the first charged particle event is detected by the charged particle camera; second logic to generate a second charged particle event indicator that identifies a second time and a second location in the defective pixel region; and third logic to output data representative of the charged particle event indicators.

Example 78 includes the subject matter of Example 77, and further specifies that the second charged particle event indicator is not representative of a charged particle event detected by the charged particle camera.

Example 79 includes the subject matter of any of Examples 77-78, and further specifies that the second logic is to generate the second charged particle event indicator based at least in part on the first charged particle event.

Example 80 includes the subject matter of any of Examples 77-79, and further specifies that the second logic is to generate the second charged particle event indicator based at least in part on the first time.

Example 81 includes the subject matter of any of Examples 77-80, and further specifies that the second logic is to generate the second charged particle event indicator based at least in part on the first location.

Example 82 includes the subject matter of any of Examples 77-81, and further specifies that the second logic is to generate the second charged particle event indicator probabilistically based at least in part on the first charged particle event.

Example 83 includes the subject matter of any of Examples 77-82, and further specifies that the first location is adjacent to the second location.

Example 84 includes the subject matter of any of Examples 77-83, and further specifies that the first time is equal to the second time.

Example 85 includes the subject matter of any of Examples 77-84, and further specifies that the first time is associated with a same frame as the second time.

Example 86 includes the subject matter of any of Examples 77-85, and further specifies that the data output by the third logic is representative of a charged particle event not occurring at a third time and third location, and the second logic is to generate the second charged particle event indicator probabilistically based at least in part on the charged particle event not occurring at the third time and third location.

Example 87 includes the subject matter of Example 86, and further specifies that the second location is adjacent to the third location.

Example 88 includes the subject matter of any of Examples 86-87, and further specifies that the second time is equal to the third time.

Example 89 includes the subject matter of any of Examples 77-88, and further specifies that the second time is associated with a same frame as the third time.

Example 90 includes the subject matter of any of Examples 77-89, and further specifies that the second logic is to generate the second charged particle event indicator probabilistically based at least in part on a distance between the first location and the second location.

Example 91 includes the subject matter of Example 90, and further specifies that the data output by the third logic is representative of a charged particle event not occurring at a third time and third location, and the second logic is to generate the second charged particle event indicator probabilistically based at least in part on a distance between the second location and the third location.

Example 92 includes the subject matter of any of Examples 77-91, and further specifies that the second logic is to generate the second charged particle event indicator probabilistically based at least in part on a difference between the first time and the second time.

Example 93 includes the subject matter of any of Examples 77-92, and further specifies that the data output by the third logic is representative of a charged particle event not occurring at a third time and third location, and the second logic is to generate the second charged particle event indicator probabilistically based at least in part on a difference between the second time and the third time.

Example 94 includes the subject matter of any of Examples 77-93, and further specifies that the second logic is to generate the second charged particle event indicator based on one or more charged particle events occurring at one or more locations proximate to the second location.

Example 95 includes the subject matter of Example 94, and further specifies that the one or more locations proximate to the second location are one or more locations neighboring the second location.

Example 96 includes the subject matter of Example 95, and further specifies that the second location includes a pixel, and the one or more locations neighboring the second location are one or more pixels neighboring the pixel.

Example 97 includes the subject matter of any of Examples 95-96, and further specifies that the one or more locations proximate to the second location includes a first proximate location and a second proximate location, and the second logic is to generate the second charged particle event indicator probabilistically with greater probability based on a charged particle event at the first proximate location than a charged particle event at the second proximate location.

Example 98 includes the subject matter of any of Examples 95-97, and further specifies that the second logic is to generate the second charged particle event indicator probabilistically with unequal probabilities of generating the second charged particle event indicator and not generating the second charged particle event indicator.

Example 99 includes the subject matter of any of Examples 77-98, and further specifies that the defective pixel region includes a line of pixels.

Example 100 includes the subject matter of any of Examples 77-98, and further specifies that the defective pixel region includes a single pixel.

Example 101 includes the subject matter of any of Examples 77-98, and further specifies that the defective pixel region includes multiple adjacent lines of pixels.

Example 102 includes the subject matter of any of Examples 77-98, and further specifies that the defective pixel region includes a rectangular area of pixels.

Example 103 includes the subject matter of any of Examples 77-98, and further specifies that the defective pixel region includes a non-rectangular area of pixels.

Example 104 includes the subject matter of any of Examples 77-103, and further specifies that the data output by the third logic includes electron event representation (EER) data.

Example 105 includes the subject matter of any of Examples 77-104, and further specifies that the second charged particle event indicator identifies that the second charged particle event indicator is not representative of a detected charged particle event.

Example 106 includes the subject matter of any of Examples 77-104, and further specifies that the second charged particle event indicator does not identify that the second charged particle event indicator is not representative of a detected charged particle event.

Example 107 includes the subject matter of any of Examples 77-106, and further specifies that the third logic is to output data representative of the defective pixel region.

Example 108 includes the subject matter of Example 107, and further specifies that the third logic is to output data representative of the defective pixel region in an Extensible Markup Language (XML) file, a JavaScript Object Notation (JSON) file, or a Comma-Separated Value (CSV) file.

Example 109 includes the subject matter of any of Examples 77-107, and further specifies that the third logic is to output data representative of the defective pixel region along with the data representative of the charged particle event indicators.

Example 110 includes the subject matter of any of Examples 77-109, and further specifies that the third logic is to output the data to reconstruction logic.

Example 111 includes the subject matter of Example 110, and further specifies that the reconstruction logic is to perform single particle analysis or tomographic reconstruction.

Example 112 includes the subject matter of any of Examples 77-111, and further specifies that the first logic, first logic, and third logic are included in the charged particle camera.

Example 113 includes the subject matter of any of Examples 77-112, and further specifies that the third logic is to output a list of defective pixels of the defective pixel region.

Example 114 includes the subject matter of any of Examples 77-113, and further specifies that the third logic is to store an initial identification of the defective pixel region and to update its identification of the defective pixel region after commencement of operation of the charged particle camera.

Example 115 includes the subject matter of any of Examples 77-114, and further specifies that the third logic is to output the data representative of the charged particle event indicators by streaming the data representative of the charged particle event indicators.

Example 116 includes the subject matter of any of Examples 77-115, and further specifies that the charged particle camera is included in a charged particle microscope.

Example 117 includes the subject matter of Example 116, and further includes: a charged particle sensor, of the charged particle camera, to detect charged particle events.

Example A includes any of the CPM support modules disclosed herein.

Example B includes any of the methods disclosed herein.

Example C includes any of the GUIs disclosed herein.

Example D includes any of the CPM support computing devices and systems disclosed herein.

The invention claimed is:

1. A charged particle microscope support apparatus, comprising:
    first logic to identify a defective pixel region of a charged particle camera, wherein the charged particle camera cannot detect charged particle events in the defective pixel region;
    second logic to generate a first charged particle event indicator that identifies a first time and a first location of a first charged particle event outside the defective pixel region, wherein the first charged particle event is detected by the charged particle camera;
    third logic to generate a second charged particle event indicator that identifies a second time and a second location in the defective pixel region, wherein the third logic is to generate the second charged particle event indicator probabilistically based at least in part on the first charge particle event; and
    fourth logic to output data representative of the charged particle event indicators.

2. The charged particle microscope support apparatus of claim 1, wherein the second charged particle event indicator is not representative of a charged particle event detected by the charged particle camera.

3. The charged particle microscope support apparatus of claim 1, wherein the defective pixel region includes a line of pixels or a rectangular array of pixels.

4. The charged particle microscope support apparatus of claim 1, wherein the data output by the fourth logic includes locations of the charged particle events associated with the charged particle event indicators and times of the charged particle events associated with the charged particle event indicators.

5. The charged particle microscope support apparatus of claim 1, wherein the second charged particle event indicator identifies that the second charged particle event indicator is not representative of a detected charged particle event.

6. The charged particle microscope support apparatus of claim 1, wherein the second charged particle event indicator does not identify that the second charged particle event indicator is not representative of a detected charged particle event.

7. The charged particle microscope support apparatus of claim 1, wherein the data output by the fourth logic is representative of a charged particle event not occurring at a third time and third location, and the third logic is to generate the second charged particle event indicator probabilistically based at least in part on the charged particle event not occurring at the third time and third location.

8. The charged particle microscope support apparatus of claim 7, wherein the third time is based on the second time.

9. A charged particle microscope support apparatus, comprising:
    first logic to identify a defective pixel region of a charged particle camera, wherein the charged particle camera cannot detect charged particle events in the defective pixel region;
    second logic to generate a charged particle event indicator for a location in the defective pixel region based at least in part on one or more charged particle events detected outside the defective pixel region, wherein the second logic is to generate the charged particle event indicator probabilistically based at least in part on one or more charged particle events detected outside the defective pixel region by generating the charged particle event with a first probability when a charged particle event occurs at a location outside the defective pixel region and by generating the charged particle event with a second probability when no charged particle event occurs at the location outside the defective pixel region; and
    third logic to output data representative of the charged particle event indicator.

10. The charged particle microscope support apparatus of claim 9, wherein the location outside the defective pixel region is a location adjacent to the defective pixel region.

11. The charged particle microscope support apparatus of claim 9, wherein the second logic is to generate the charged particle event indicator for the location in the defective pixel region in a frame capture time interval based at least in part on one or more charged particle events detected outside the defective pixel region in the frame capture time interval.

12. The charged particle microscope support apparatus of claim 9, wherein the second logic is to generate the charged particle event indicator for the location in the defective pixel region in a frame capture time interval based at least in part on one or more charged particle events detected outside the defective pixel region outside the frame capture time interval.

13. The charged particle microscope support apparatus of claim 9, wherein the first logic is to store an initial identification of the defective pixel region and to update its identification of the defective pixel region after commencement of operation of the charged particle camera.

14. The charged particle microscope support apparatus of claim 9, wherein the charged particle camera is included in a charged particle microscope.

15. The charged particle microscope support apparatus of claim 9, wherein the defective pixel region includes a line of pixels.

16. A charged particle microscope support apparatus, comprising:
    first logic to generate a first charged particle event indicator that identifies a first time and a first location of a first charged particle event outside a defective pixel region of a charged particle camera, wherein the first charged particle event is detected by the charged particle camera;
    second logic to generate a second charged particle event indicator that identifies a second time and a second location in the defective pixel region, wherein the second logic is to generate the second charged particle event indicator probabilistically based at least in part on the first charged particle event; and
    third logic to output data representative of the charged particle event indicators.

17. The charged particle microscope support apparatus of claim 16, wherein the third logic is to output data representative of the defective pixel region.

18. The charged particle microscope support apparatus of claim 17, wherein the third logic is to output data representative of the defective pixel region in an Extensible Markup Language (XML) file, a JavaScript Object Notation (JSON) file, or a Comma-Separated Value (CSV) file.

19. The charged particle microscope support apparatus of claim 16, wherein the third logic is to output the data to reconstruction logic.

20. The charged particle microscope support apparatus of claim 19, wherein the reconstruction logic is to perform single particle analysis or tomographic reconstruction.

* * * * *

UNITED STATES PATENT AND TRADEMARK OFFICE
CERTIFICATE OF CORRECTION

PATENT NO. : 11,742,175 B2
APPLICATION NO. : 17/364802
DATED : August 29, 2023
INVENTOR(S) : Erik Michiel Franken et al.

Page 1 of 1

It is certified that error appears in the above-identified patent and that said Letters Patent is hereby corrected as shown below:

In the Claims

In Column 25, Claim 1, Line 36, delete "charge" and insert -- charged --, therefor.

Signed and Sealed this
Twenty-fourth Day of October, 2023

Katherine Kelly Vidal
*Director of the United States Patent and Trademark Office*